United States Patent
Lin et al.

(10) Patent No.: US 9,495,495 B2
(45) Date of Patent: Nov. 15, 2016

(54) SCAN CELL ASSIGNMENT

(71) Applicant: Taiwan Semiconductor Manufacturing Company Limited, Hsin-Chu (TW)

(72) Inventors: Cheng-Chung Lin, Hsinchu (TW); Ming-Zhang Kuo, Qionglin Township (TW); Sang Hoo Dhong, Hsin-Chu (TW); Ho-Chieh Hsieh, Hsinchu (TW); Kuo Feng Tseng, Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 8 days.

(21) Appl. No.: 14/243,975

(22) Filed: Apr. 3, 2014

(65) Prior Publication Data
US 2015/0286760 A1 Oct. 8, 2015

(51) Int. Cl.
*G06F 9/455* (2006.01)
*G06F 17/50* (2006.01)

(52) U.S. Cl.
CPC ......... *G06F 17/5045* (2013.01); *G06F 17/505* (2013.01); *G06F 2217/14* (2013.01)

(58) Field of Classification Search
USPC ....................................................... 716/119
See application file for complete search history.

(56) References Cited

U.S. PATENT DOCUMENTS

| | | | |
|---|---|---|---|
| 2008/0005635 A1* | 1/2008 | Kaibel et al. | 714/731 |
| 2008/0201669 A1* | 8/2008 | Weiner et al. | 716/2 |
| 2008/0256274 A1* | 10/2008 | Wohl et al. | 710/68 |
| 2010/0332928 A1* | 12/2010 | Li et al. | 714/731 |
| 2011/0258498 A1* | 10/2011 | Chandra et al. | 714/726 |

OTHER PUBLICATIONS

Rahimi et al., Layout Driven Synthesis of Multiple Scan Chains, Mar. 2003, IEEE Transactions on Computer-Aided Design of Integrated Circuits and Systems, vol. 22, Issue 3, pp. 317-326.*
Riley, et al., "Testability Features of the First-Generation Cell Processor", Paper 6.1, International Test Conference, 2005, IEEE, pp. 1-9, http://ieeexplore.ieee.org/cart/download.jsp-?partnum=1583967&searchProductType=1EEE% 20Conferences.

* cited by examiner

*Primary Examiner* — Bryce Aisaka
(74) *Attorney, Agent, or Firm* — Cooper Legal Group, LLC

(57) ABSTRACT

One or more systems and methods for scan cell assignment for a design layout of a semiconductor arrangement are provided. The design layout is evaluated to identify a set of sequential cells, such as flip flops connected to circuitry by data paths. Sequential cells within the set of sequential cells are assigned to either a scan cell assignment or a non-scan cell assignment based upon a control path criterion, a register bank criterion, a pipeline depth criterion, a sequential loop criterion, or other criteria to create a cell assignment list. Scan paths are connected to sequential cells assigned to the scan cell assignment so that test patterns can be sent to and received from such sequential cells during testing of the semiconductor arrangement for defects. Power, performance, and area utilization are improved because at least some sequential cells are assigned to the non-scan cell assignment.

20 Claims, 8 Drawing Sheets

SCAN CELL ASSIGNMENT

BACKGROUND

Many semiconductor arrangements comprise numerous sequential cells, such flip flops, that are connected to circuitry, such as logic structures, by data paths. A full scan scheme is used to test a semiconductor arrangement for design defects and processing defects. In a full scan scheme, scan paths are connected to the sequential cells so that a test scan pattern can be directly provided to the sequential cells, as opposed to being provided through data paths that otherwise increase computational overhead because the effect of circuitry on the test scan pattern is taken into account. The full scan scheme provides relatively high test coverage because the test scan pattern is directly input into sequential cells. However, connecting additional scan paths to sequential cells for the full scan increases power consumption, decreases performance, and increases area overhead.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
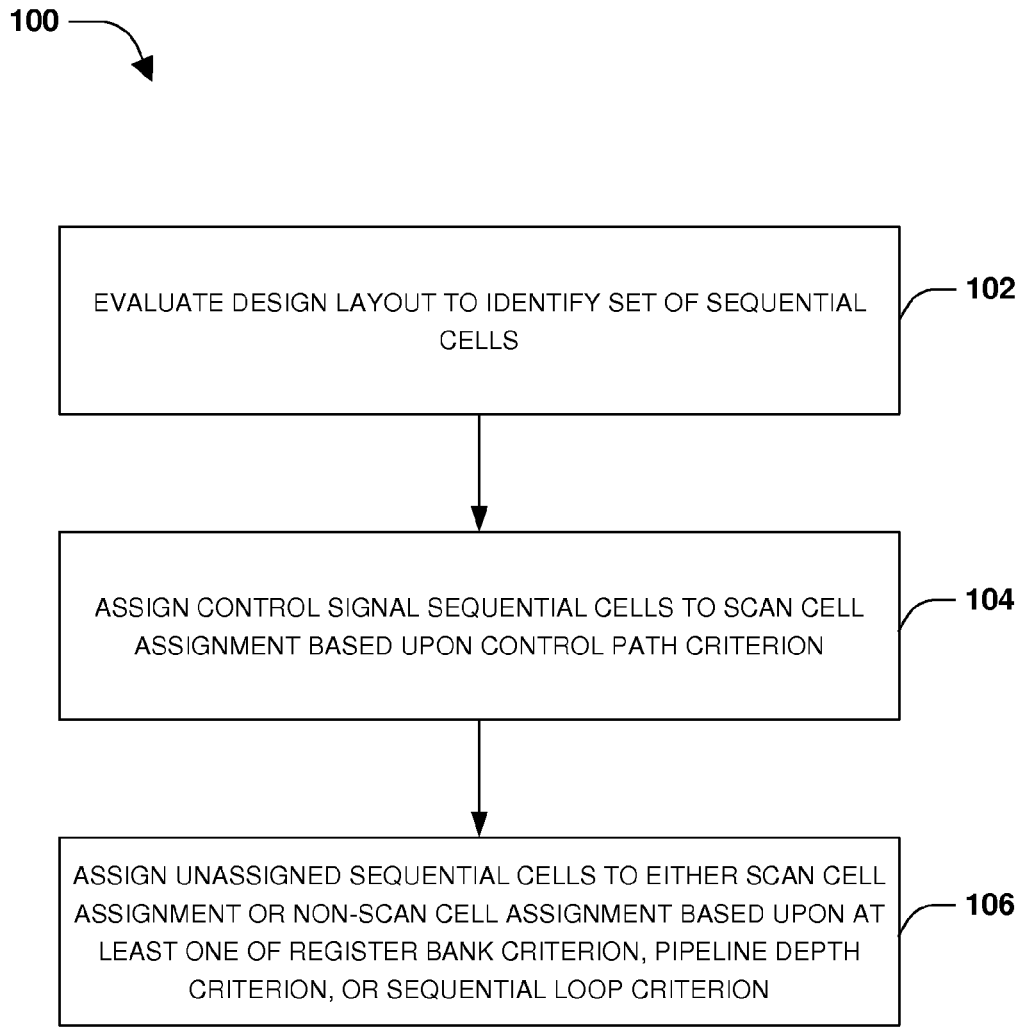
FIG. 1 is a flow diagram illustrating a method of scan cell assignment for a design layout, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more systems and techniques for scan cell assignment for a design layout are provided. The design layout describes a semiconductor arrangement, such as a set of sequential cells associated with the semiconductor arrangement. Sequential cells of the semiconductor arrangement are assigned to either a scan cell assignment or a non-scan cell assignment. If a sequential cell is assigned to the scan cell assignment, then a scan path, providing direct access to the sequential cell for defect testing, is connected to the sequential cell. If a sequential cell is assigned to the non-scan cell assignment, then no scan path is connected to the sequential cell, and thus the sequential cell is merely connected to other circuitry of the semiconductor arrangement by one or more data paths. In some embodiments, a sequential cell is assigned based upon a control path criterion specifying that sequential cells within a control path are to be assigned to the scan cell assignment. In some embodiments, a sequential cell is assigned based upon a register bank criterion specifying that if a register bank comprises at least one sequential cell that is a non-scan cell assignment candidate, then sequential cells within the register bank are to be assigned to the non-scan cell assignment. In some embodiments, a sequential cell is assigned based upon a pipeline depth criterion specifying that a reduced non-scan cell assignment is to be used for assigning sequential cells of a pipeline. In some embodiments, a sequential cell is assigned based upon a sequential loop criterion specifying that at least one sequential cell of a structural sequential loop is to be assigned to the scan cell assignment. In this way, sequential cells are assigned based upon a partial scan scheme that provides adequate test coverage of sequential cells assigned to the scan cell assignment having additional scan paths for testing, while improving performance, power, and area due to sequential cells assigned to the non-scan cell assignment lacking additional scan paths for testing.

A method 100 of scan cell assignment for a design layout is illustrated in FIG. 1. A semiconductor arrangement comprises one or more circuitry arrangements, such a logic gate, an adder, a NAD gate, a NOR gate, or other logic structure, that are connected by sequential cells, such as flip flops, along data paths. At 102, a design layout for the semiconductor arrangement is evaluated to identify a set of sequential cells associated with the semiconductor arrangement. In some embodiments, the design layout is evaluated by a synthesis process that generates a gate level netlist that identifies the set of sequential cells.

The set of sequential cells are assigned to either a scan cell assignment or a non-scan cell assignment based upon various criteria and thresholds. If a sequential cell is assigned to the scan cell assignment, then a scan path is connected to the sequential cell so that a test scan pattern can be directly provided to the sequential cell for testing. If a sequential cell is assigned to the non-scan cell assignment, then no additional scan path is connected to the sequential cell, which improves power, performance, and area of the semiconductor arrangement. In some embodiments, the set of sequential cells are assigned based upon a non-scan cell threshold corresponding to a number or percentage of sequential cells that are to be assigned to the non-scan cell assignment, such as 45% of sequential cells or any other number or percentage.

The set of sequential cells are assigned based upon at least one of a control path criterion, a register bank criterion, a pipeline depth criterion, or a sequential loop criterion. At 104, control signal sequential cells within the set of sequential cells are assigned to the scan cell assignment based upon a control path criterion to generate an initial cell assignment. A control signal sequential cell comprises a sequential cell that is configured to store a control signal, such as a signal used to control a multiplexer, as opposed to a data signal. The control path criterion specifies that if a sequential cell is a control signal sequential cell, then the sequential cell is to be assigned to the scan cell assignment. Control signal sequential cells are assigned to the scan cell assignment so that additional scan paths are connected to the control signal sequential cells. In this way, relevant data path logic gates and sequential cells could be chosen to be tested with the semiconductor arrangement by sending test scan patterns to the control signal sequential cells through the scan paths.

At 106, unassigned sequential cells within the set of sequential cell are assigned to either the scan cell assignment or the non-scan cell assignment based upon at least one of a register bank criterion, a pipeline depth criterion, or a sequential loop criterion to update the initial cell assignment list to create a cell assignment list. In some embodiments of applying the register bank criterion, a register bank comprising a sequential cell grouping of the set of sequential cells is identified. In some embodiments, the sequential cell grouping corresponds to a logical grouping of sequential cells, such as sequential cells used to form an adder, circuit to bit cells, or other logic component. Responsive to identifying at least one sequential cell within the sequential cell grouping as being a non-scan cell assignment candidate, unassigned sequential cells within the sequential cell grouping are assigned to the non-scan cell assignment based upon the register bank criterion. Assigning sequential cells within the sequential cell grouping to the same assignment, such as the non-scan cell assignment, results in similar pipeline depths for pipelines of sequential cells and circuitry arrangement of the semiconductor arrangement, which decreases complexity for generating test scan patterns and isolating defects.

In some embodiments of applying the pipeline depth criterion, a pipeline comprising one or more sequential cells and one or more circuitry arrangements is identified. A starting sequential cell, which lacks an assignment, of the pipeline is assigned to the scan cell assignment. An ending sequential cell, which lacks an assignment, of the pipeline is assigned to the scan cell assignment. One or more unassigned sequential cells between the starting sequential cell and the ending sequential cell are assigned to the non-scan cell assignment according to a reduced non-scan cell assignment specified by the pipeline depth criterion. Reducing the depth of non-scan sequential cells between scan sequential cells within pipelines, such as merely a single non-sequential cell between scan sequential cells, reduces complexity for managing test scan patterns and isolating defects.

In some embodiments of applying the sequential loop criterion, a structural sequential loop is identified within the design layout. In some embodiments, the structural sequential loop corresponds to a data path from a sequential cell to prior circuitry in a pipeline. At least one unassigned sequential cell within the structural sequential loop is assigned to the scan cell assignment based upon the sequential loop criterion. In this way, the test scan pattern is input into at least one sequential cell so that a deterministic pattern from the test scan pattern is used to initialize the structural sequential loop.

In some embodiments, a violation of the cell assignment list is identified, such as a violation of the non-scan cell threshold where a number of sequential cells assigned to the non-scan cell assignment do not satisfy the non-scan cell threshold. The non-scan cell threshold is adjusted, such as increased or decreased based upon a current sequential cell assignment of sequential cells of the semiconductor arrangement, to create an adjusted non-scan cell threshold. At least one sequential cell assignment within the cell assignment list is adjusted, such as a reassignment of a sequential cell to the scan cell assignment or the non-scan cell assignment, based upon the adjust non-scan cell threshold.

In some embodiments, the cell assignment list is evaluated based upon a test coverage threshold metric corresponding to a threshold number of sequential cells assigned to the scan cell assignment. In some embodiments, the test coverage threshold metric is not satisfied if the cell assignment list does not comprise a threshold number of sequential cells assigned to the scan cell assignment. Responsive to the cell assignment list not satisfying the test coverage threshold metric, the non-scan cell threshold is adjusted, such as decreased so that additional sequential cells are reassigned to the scan cell threshold. At least one sequential cell assignment within the cell assignment list is adjusted based upon the adjusted non-scan cell threshold.

In some embodiments, the semiconductor arrangement is generated based upon the design layout, such that scan paths are connected to sequential cells assigned to the scan cell assignment and no scan paths are connected to sequential cells assigned to the non-scan cell assignment. The semiconductor arrangement is tested for defects by sending an input pattern, through scan paths, to sequential cells assigned to the scan cell assignment. An output pattern is received from the sequential cells assigned to the scan cell assignment. The output pattern is compared to an expected pattern to identify at least one of a design defect or a processing defect for the semiconductor arrangement.

Figure 2:
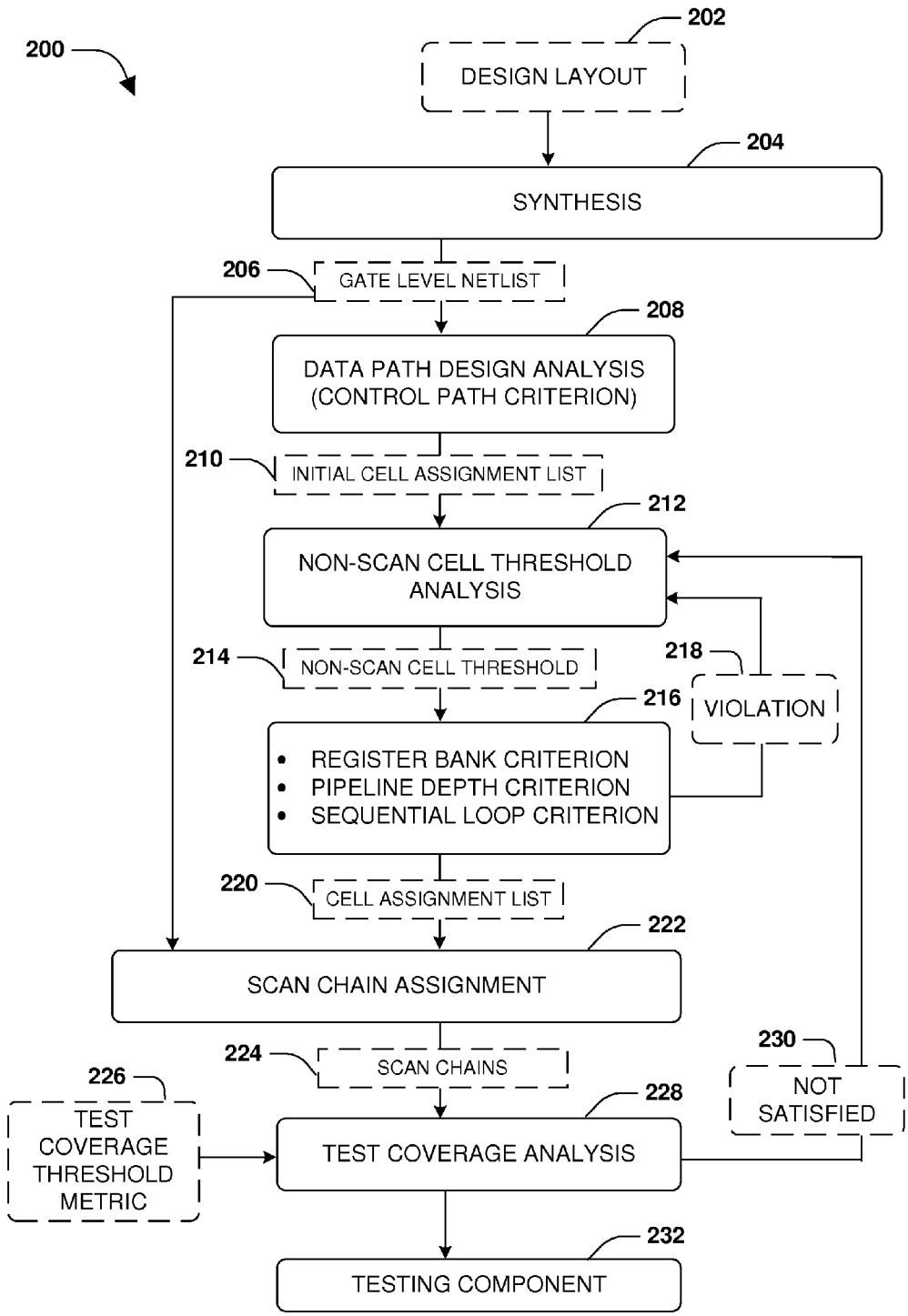
FIG. 2 is a flow diagram illustrating a method of scan cell assignment for a design layout, in accordance with some embodiments.

FIG. 2 illustrates a flow diagram 200 for testing a semiconductor arrangement. A design layout 202 is evaluated by a synthesis process 204 to generate a gate level netlist 206 for the semiconductor arrangement. The gate level netlist 206 may identify a set of sequential cells, such as flip flops, of the semiconductor arrangement. The set of sequential cells are evaluated by a data path design analysis 208 according to a control path criterion to generate an initial cell assignment list 210. In some embodiments, control signal sequential cells are assigned to a scan cell assignment based upon the control path criterion.

Unassigned sequential cells are evaluated by a non-scan cell threshold analysis 212 where unassigned sequential cells are assigned to either the scan cell assignment or a non-scan cell assignment based upon a non-scan cell threshold 214. In some embodiments, the non-scan cell threshold 214 specifies that a percentage, such as 40%, of sequential cells of the semiconductor arrangement as to be assigned to the non-scan cell assignment. In this way, unassigned cells are assigned 216 based upon the non-scan cell threshold 214 and at least one of a register bank criterion, a pipeline depth criterion, or a sequential loop criterion to create a cell assignment list 220. The cell assignment list 220 comprises an assignment of sequential cells to either the scan cell assignment or the non-scan cell assignment. If a violation 218 of the non-scan cell threshold 214 is detected, then the non-scan cell threshold is adjusted for reassignment of one or more sequential cells.

In some embodiments, scan chain assignment 220 is performed to group sequential cells into one or more scan chains 224 based upon at least one of the cell assignment list 220 or the gate level netlist 206. A scan chain comprises one or more sequential cells, assigned to the scan cell assignment, that are operatively coupled together. Test coverage analysis 228 is performed based upon at least one of the one or more scan chains 224 or the cell assignment list 220 to determine whether a test coverage threshold metric 226 is satisfied. If the test coverage threshold metric is not satisfied 230, such as the cell assignment list 220 not comprising at least a threshold number of sequential cell assigned to the scan cell assignment, the non-scan cell threshold 214 is adjusted for reassignment of one or more sequential cells. In some embodiments, the non-scan cell threshold 214 is decreased so that one or more sequential cells are reassigned from the non-scan cell assignment to the scan cell assignment to improve test coverage. A testing component 232 is configured to test the semiconductor arrangement by sending an input pattern through scan paths to sequential cells assigned to the scan cell assignment. The testing component 232 is configured to receive an output pattern from the sequential cells assigned to the scan cell assignment. The testing component 232 is configured to compare the output pattern to an expected pattern to identify at least one of a design defect or a processing defect for the semiconductor arrangement.

Figure 3:
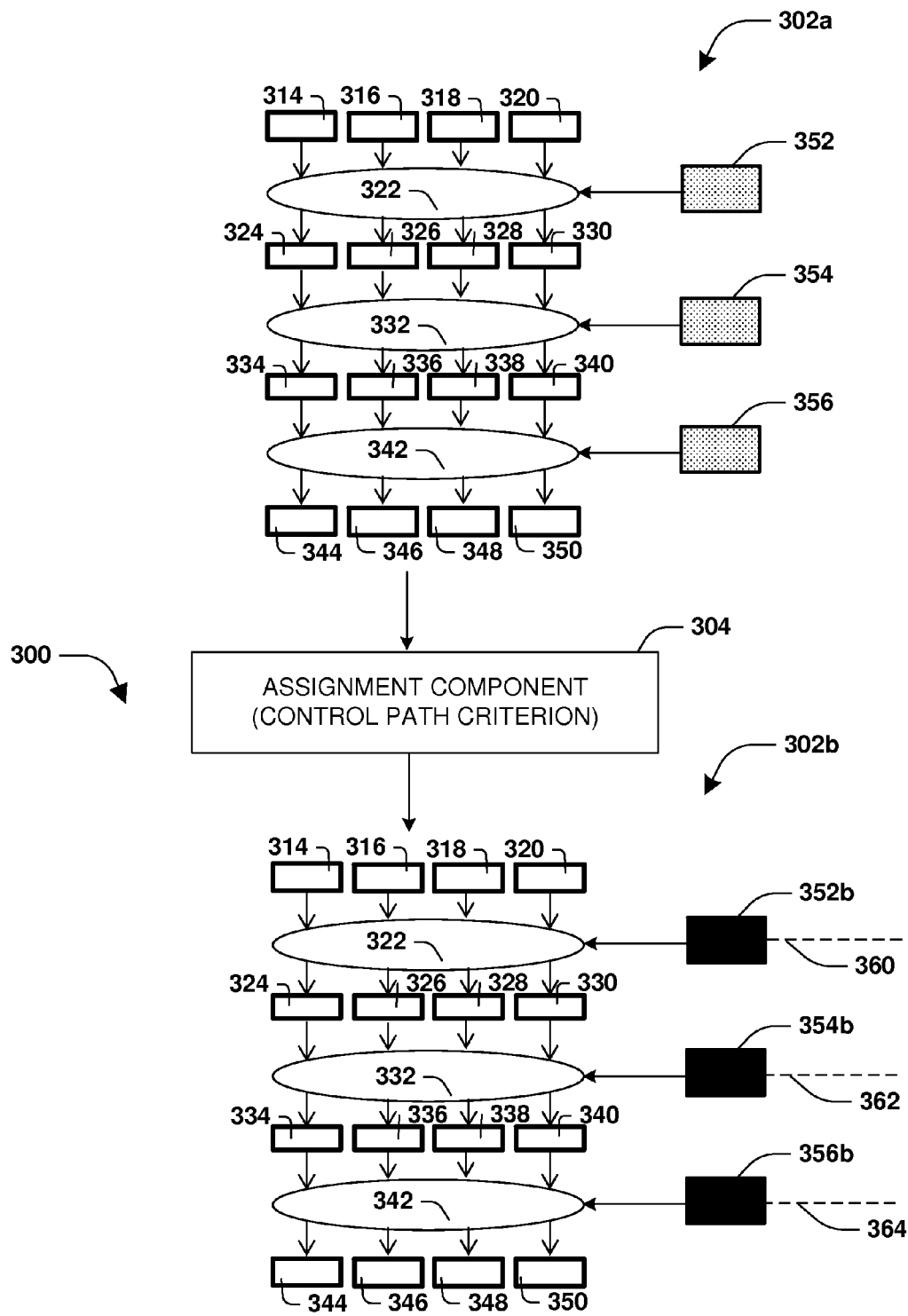
FIG. 3 is an illustration of a system for scan cell assignment based upon a control path criterion, in accordance with some embodiments.

FIG. 3 illustrates a system 300 for assigning sequential cells of an unassigned design layout 302a to either a scan cell assignment or a non-scan cell assignment based upon a control path criterion. The system 300 comprises an assignment component 304 configured to evaluate the unassigned design layout 302a. The unassigned design layout 302a comprises one or more sequential cells connected to circuitry through data paths. In some embodiments, a first sequential cell 314, a second sequential cell 316, a third sequential cell 318, and a fourth sequential cell 320 are connected by one or more data paths to first circuitry 322. A fifth sequential cell 324, a sixth sequential cell 326, a seventh sequential cell 328, and an eighth sequential cell 330 are connected by one or more data paths to the first circuitry 322 and second circuitry 332. A ninth sequential cell 334, a tenth sequential cell 336, an eleventh sequential cell 338, and a twelfth sequential cell 340 are connected by one or more data paths to the second circuitry 332 and the third circuitry 342. A thirteen sequential cell 344, a fourteenth sequential cell 346, a fifteenth sequential cell 348, and a sixteenth sequential cell 350 are connected by one or more data paths to the third circuitry 342.

The assignment component 304 is configured to identify one or more control signal sequential cells, such as a first control signal sequential cell 352, a second control signal sequential cell 354, and a third control signal sequential cell 356, of the unassigned design a layout 302a. In some embodiments, the first control signal sequential cell 352 is identified based upon the first control signal sequential cell 352 providing a control signal to the first circuitry 322, the second control signal sequential cell 354 is identified based upon the second control signal sequential cell 354 providing a control signal to the second circuitry 332, and the third control signal sequential cell 356 is identified based upon the third control signal sequential cell 356 providing a control signal to the third circuitry 342. The assignment component 304 assigns the first control signal sequential cell 352 to the scan cell assignment based upon the control path criterion, resulting in a first scan sequential cell 352b of an assigned design layout 302b. The assignment component 304 assigns the second control signal sequential cell 354 to the scan cell assignment based upon the control path criterion, resulting in a second scan sequential cell 354b of the assigned design layout 302b. The assignment component 304 assigns the third control signal sequential cell 356 to the scan cell assignment based upon the control path criterion, resulting in a third scan sequential cell 356b of the assigned design layout 302b. In this way, scan paths, such as a first scan path 360, a second scan path 362, and a third scan path 364, are connected to the first scan sequential cell 352b, the second scan sequential cell 354b, and the third scan sequential cell 356b so that a test scan pattern is directly provided to the first scan sequential cell 352b, the second scan sequential cell 354b, and the third scan sequential cell 356b without going through the previous functional sequential cells, which otherwise results in computational overhead for identification and isolation of a defect.

Figure 4:
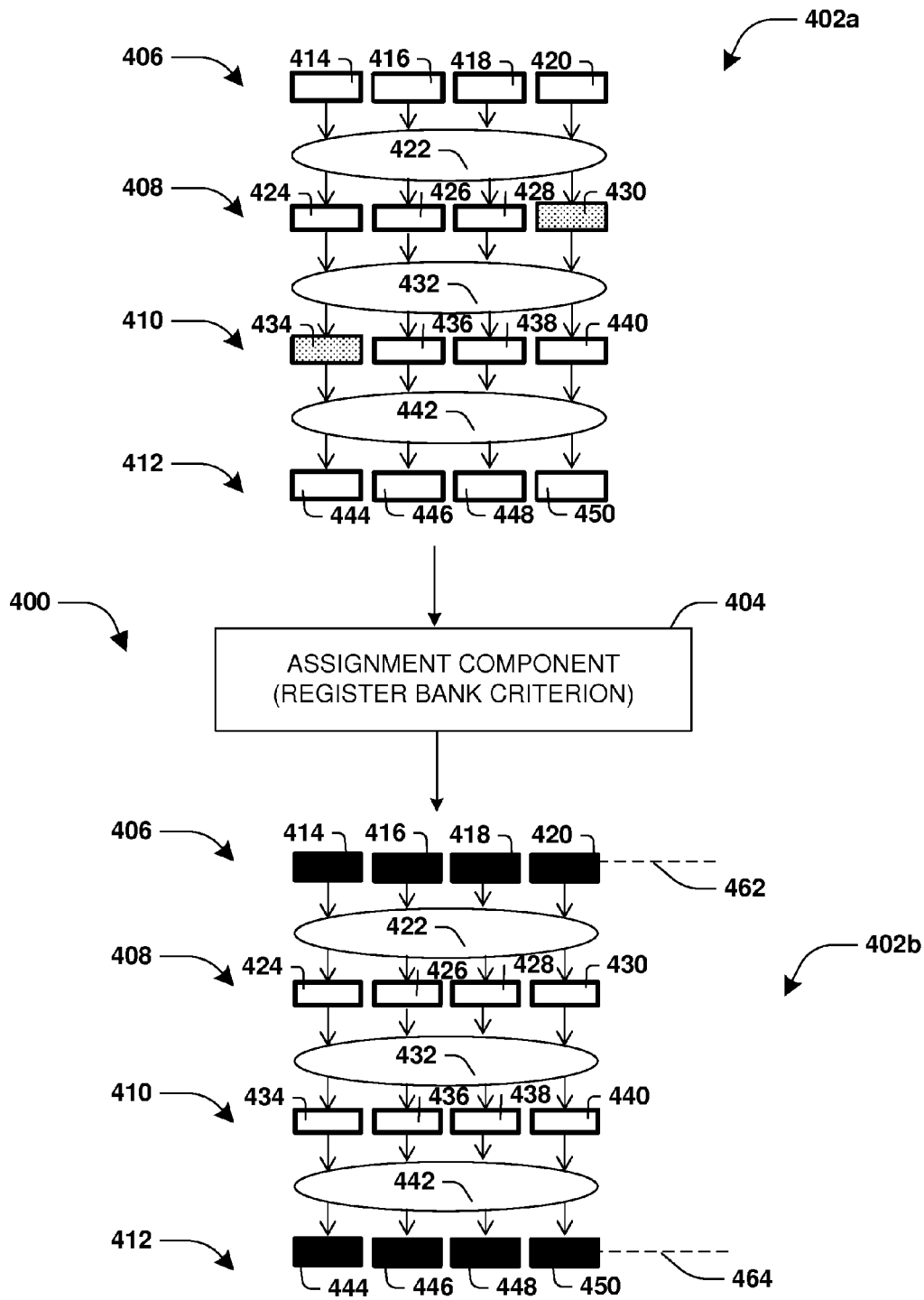
FIG. 4 is an illustration of a system for scan cell assignment based upon a register bank criterion, in accordance with some embodiments.

FIG. 4 illustrates a system 400 for assigning sequential cells of an unassigned design layout 402a to either a scan cell assignment or a non-scan cell assignment based upon a register bank criterion. The system 400 comprises an assignment component 404 configured to evaluate the unassigned design layout 402a. The unassigned design layout 402a comprises one or more sequential cells connected to circuitry through data paths. In some embodiments, a first sequential cell 414, a second sequential cell 416, a third sequential cell 418, and a fourth sequential cell 420 are connected by one or more data paths to first circuitry 422. A fifth sequential cell 424, a sixth sequential cell 426, a seventh sequential cell 428, and an eighth sequential cell 430 are connected by one or more data paths to the first circuitry 422 and second circuitry 432. A ninth sequential cell 434, a tenth sequential cell 436, an eleventh sequential cell 438, and a twelfth sequential cell 440 are connected by one or more data paths to the second circuitry 432 and third circuitry 442. A thirteen sequential cell 444, a fourteenth sequential cell 446, a fifteenth sequential cell 448, and a sixteenth sequential cell 450 are connected by one or more data paths to the third circuitry 442.

The assignment component 404 is configured to identify one or more register banks comprising sequential cell groupings. In some embodiments, the assignment component 404 identifies a first register bank 406 comprising the first sequential cell 414, the second sequential cell 416, the third sequential cell 418, and the fourth sequential cell 420. The assignment component 404 identifies a second register bank 408 comprising the fifth sequential cell 424, the sixth sequential cell 426, the seventh sequential cell 428, and the eighth sequential cell 430. The assignment component 404 identifies a third register bank 410 comprising the ninth sequential cell 434, the tenth sequential cell 436, the eleventh sequential cell 438, and the twelfth sequential cell 440. The assignment component 404 identifies a fourth register bank 412 comprising the thirteen sequential cell 444, the fourteenth sequential cell 446, the fifteenth sequential cell 448, and the sixteenth sequential cell 450. In some embodiments, a sequential cell grouping corresponds to a logical structure, such as an adder, a circuit to bit cells, etc.

The assignment component 404 determines that the eighth sequential cell 430 of the second register bank 408 is a non-scan cell assignment candidate. Accordingly, the assignment component 404 assigns the fifth sequential cell 424, the sixth sequential cell 426, the seventh sequential cell 428, and the eighth sequential cell 430 to the non-scan cell assignment. The assignment component 404 determines that the ninth sequential cell 434 of the third register bank 408 is a non-scan cell assignment candidate. Accordingly, the assignment component 404 assigns the ninth sequential cell 434, the tenth sequential cell 436, the eleventh sequential cell 438, and the twelfth sequential cell 440 to the non-scan cell assignment. In some embodiments, the assignment component 404 assigns sequential cells of the first register bank 406 and sequential cells of the fourth register bank 412 to the scan cell assignment, such that scan paths are connected to the sequential cells, such as a first scan path 462 connected to the fourth sequential cell 420 and a second scan path 464 connected to the sixteenth sequential cell 450. This is way, an assigned design layout 402b is generated so that sequential cells, assigned to the scan cell assignment, are used for defect testing of the semiconductor arrangement.

Figure 5:
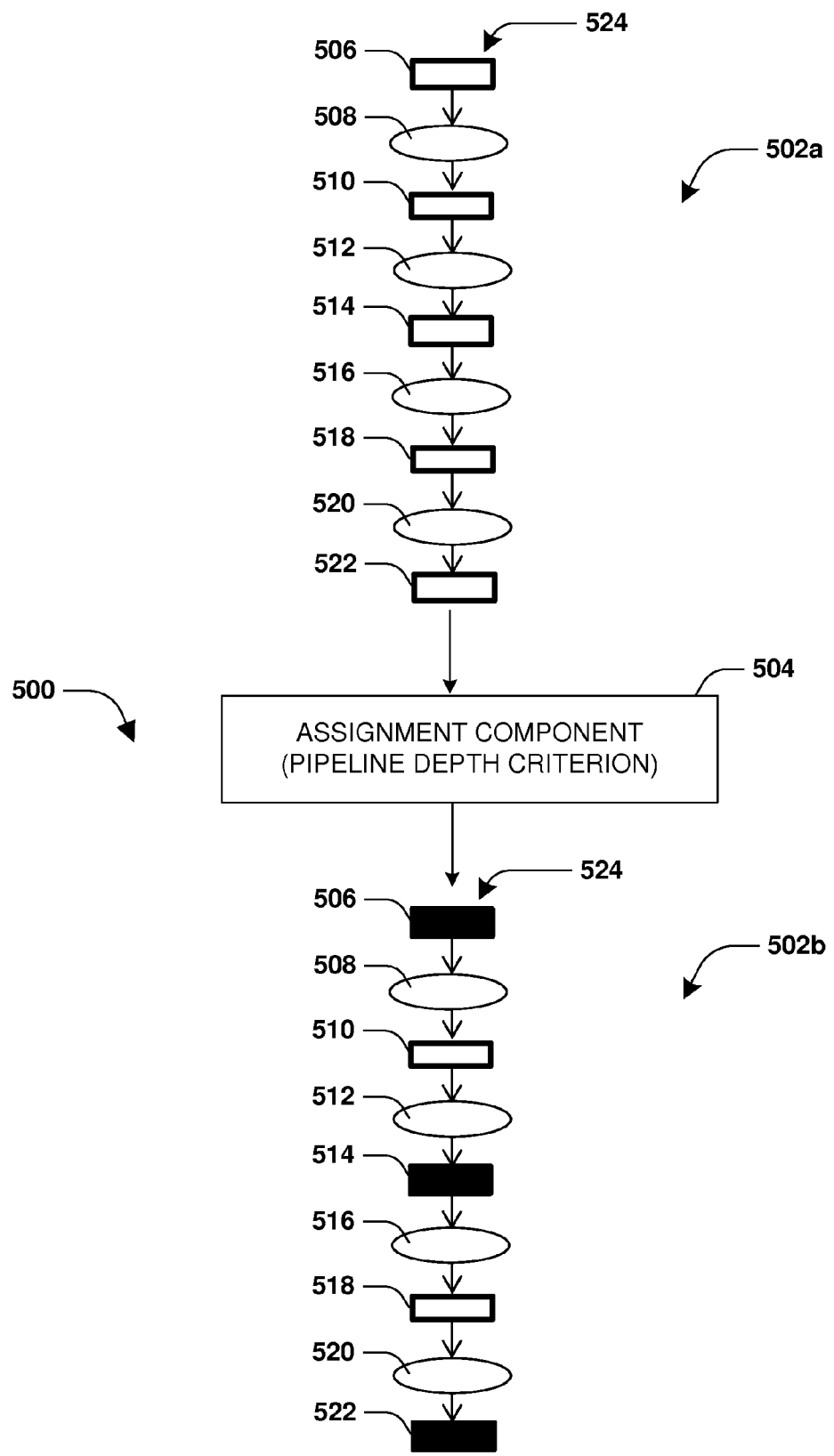
FIG. 5 is an illustration of a system for scan cell assignment based upon a pipeline depth criterion, in accordance with some embodiments.

FIG. 5 illustrates a system 500 for assigning sequential cells of an unassigned design layout 502a to either a scan cell assignment or a non-scan cell assignment based upon a pipeline depth criterion. The system 500 comprises an assignment component 504 configured to evaluate the unassigned design layout 502a. The unassigned design layout 502a comprises one or more pipelines comprising one or more sequential cells connected to circuitry through data paths. In some embodiments, a first pipeline 524 comprises a first sequential cell 506 connected to first circuitry 508, a second sequential cell 510 connected to the first circuitry 508 and second circuitry 512, a third sequential cell 514 connected to the second circuitry 512 and third circuitry 516, a fourth sequential cell 518 connected to the third circuitry 516 and fourth circuitry 520, and a fifth sequential cell 522 connected to the fourth circuitry 520.

In some embodiments, the assignment component 504 assigns the first sequential cell 506 to the scan cell assignment based upon identifying the first sequential cell 506 as a starting sequential cell. The assignment component 504 assigns the third sequential cell 514 to the scan cell assignment based upon identifying the third sequential cell 514 as an ending sequential cell. The assignment component 504 assigns the second sequential cell 510 to the non-scan assignment based upon a reduced non-scan cell assignment specified by the pipeline depth criterion, such that a reduced number of sequential cells between the starting sequential cell and the ending sequential cell are assigned to the no-scan cell assignment. In some embodiments, the assignment component 504 assigns the fifth sequential cell 522 to the scan cell assignment, and assigns the fourth sequential cell 518 to the non-scan cell assignment based upon the reduced non-scan cell assignment specified by the pipeline depth criterion, such that a reduced number of sequential cells between starting sequential cells and ending sequential cells are assigned to the non-scan cell assignment. In this way, an assigned design layout 502b, comprising pipelines having reduced depths of sequential cells assigned to non-scan cell assignment, is generated.

Figure 6:
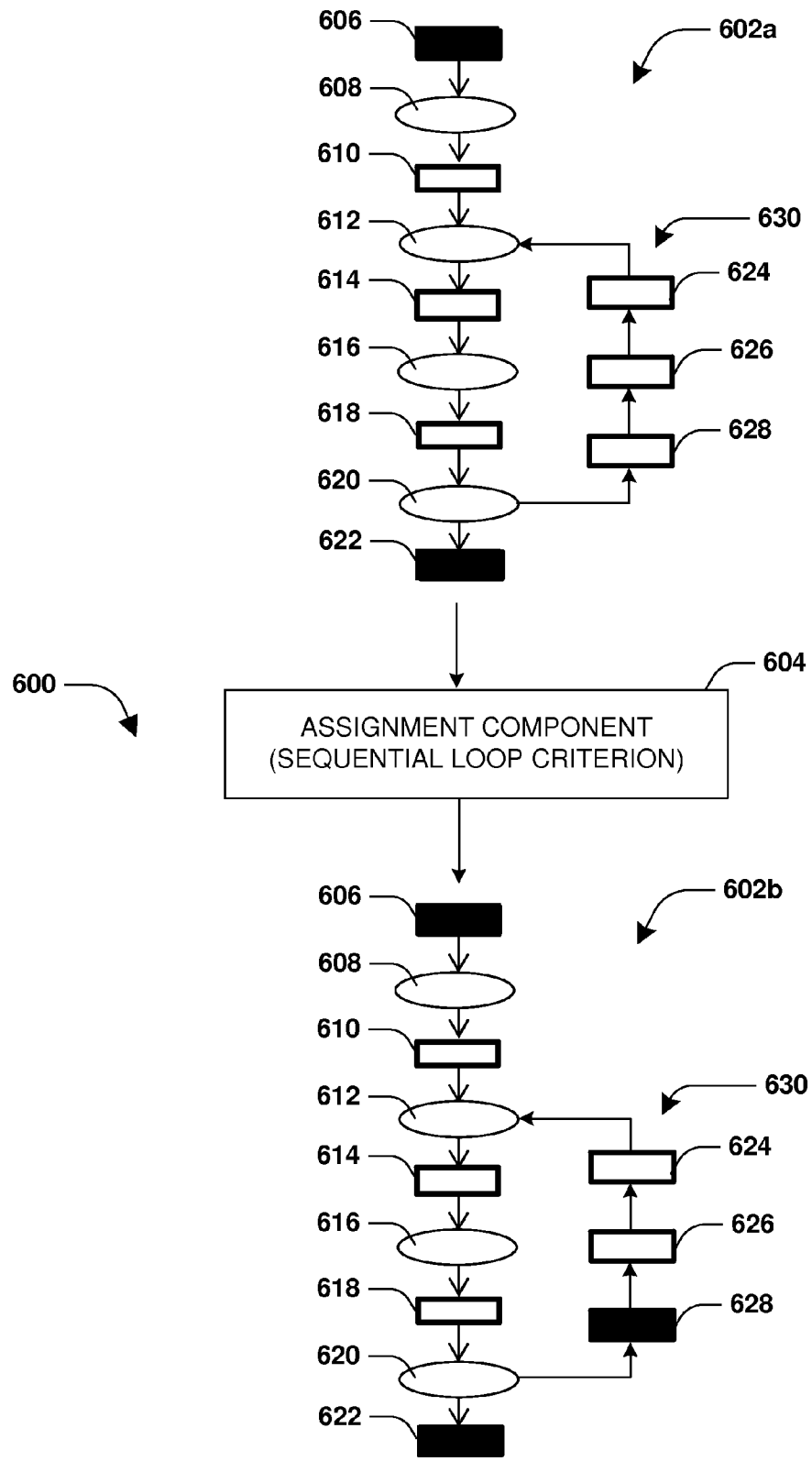
FIG. 6 is an illustration of a system for scan cell assignment based upon a sequential loop criterion, in accordance with some embodiments.

FIG. 6 illustrates a system 600 for assigning sequential cells of an unassigned design layout 602a to either a scan cell assignment or a non-scan cell assignment based upon a sequential loop criterion. The system 600 comprises an assignment component 604 configured to evaluate the unassigned design layout 602a. The unassigned design layout 602a comprises one or more sequential cells connected to circuitry through data paths. In some embodiments, the unassigned design layout 602a comprises a first sequential cell 606 connected to first circuitry 608, a second sequential cell 610 connected to the first circuitry 608 and second circuitry 612, a third sequential cell 614 connected to the second circuitry 612 and third circuitry 616, a fourth sequential cell 618 connected to the third circuitry 616 and fourth circuitry 620, and a fifth sequential cell 622 connected to the fourth circuitry 620.

In some embodiments, the assignment component 604 identifies a structural sequential loop 630 comprising a sixth sequential cell 624, a seventh sequential cell 626, and an eighth sequential cell 628 that provide a data path from the fourth circuitry 620 to the second circuitry 612. The assignment component 604 assigns at least one sequential cell within the structural sequential loop 630 to the scan cell assignment, such as the eighth sequential cell 628, based upon the sequential loop criterion, resulting in an assigned design layout 602b.

In this way, sequential cells are assigned to either a scan cell assignment or a non-scan cell assignment based upon a variety of criteria. Such assignments improve power, performance, and area because at least some sequential cells are assigned to the non-scan cell assignment, which reduces the amount of scan paths added to the semiconductor arrangement. Defect testing coverage is only slightly reduced because at least proper sequential cells are assigned to the scan cell assignment so that additional scan paths are provided for testing the semiconductor arrangement.

Figure 7:
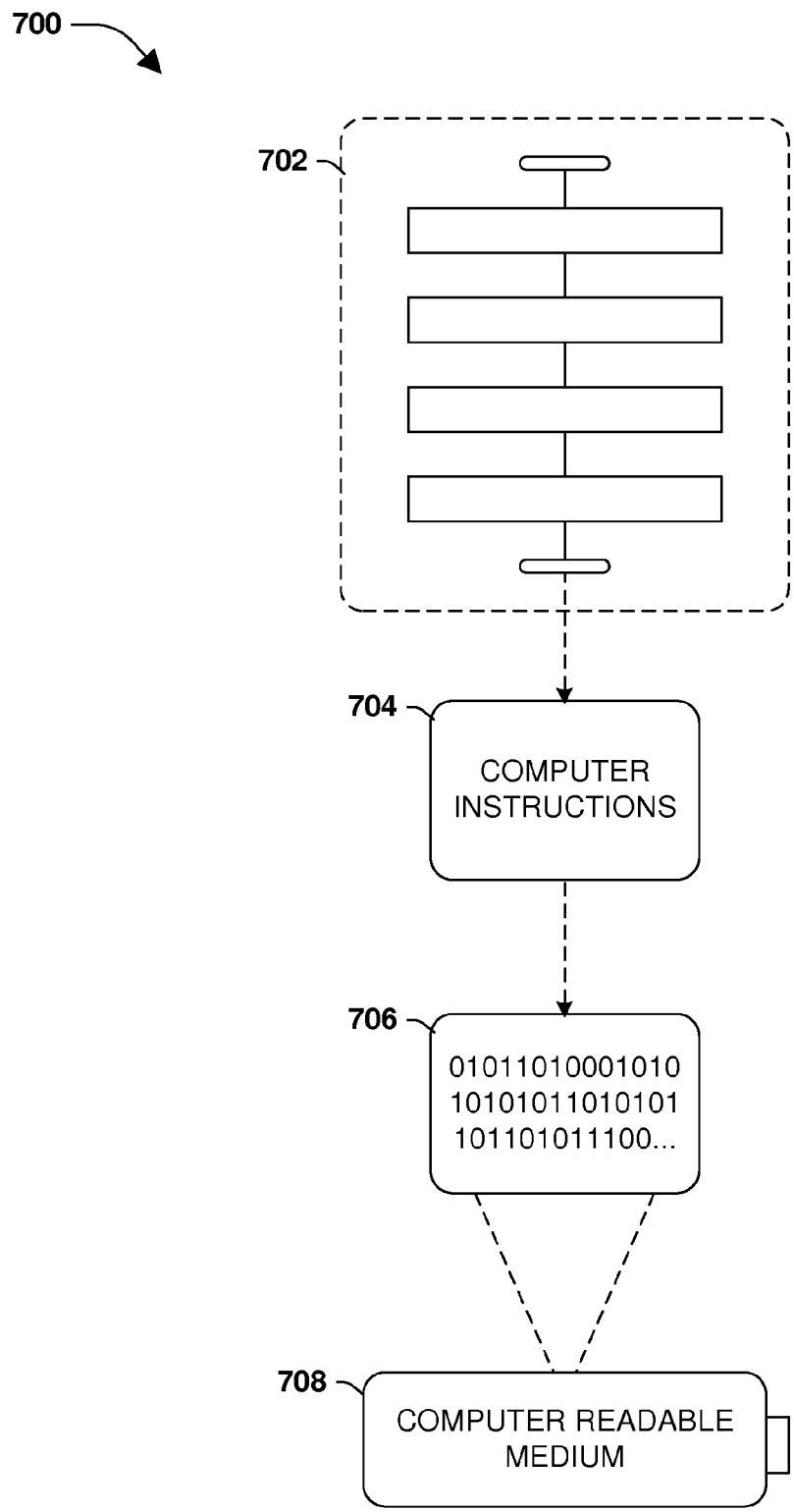
FIG. 7 is an illustration of an example computer-readable medium wherein processor-executable instructions configured to embody one or more of the provisions set forth herein may be comprised, in accordance with some embodiments.

Still another embodiment involves a computer-readable medium comprising processor-executable instructions configured to implement one or more of the techniques presented herein. An exemplary computer-readable medium is illustrated in FIG. 7, wherein the implementation 700 comprises a computer-readable medium 708 (e.g., a CD-R, DVD-R, flash drive, a platter of a hard disk drive, etc.), on which is encoded computer-readable data 706. This computer-readable data 706 in turn comprises a set of computer instructions 704 configured to operate according to one or more of the principles set forth herein. In one such embodiment 700, the processor-executable computer instructions 704 may be configured to perform a method 702, such as at least some of the exemplary method 100 of FIG. 1, for example. In another such embodiment, the processor-executable instructions 712 may be configured to implement a system, such as at least some of the exemplary system 300 of FIG. 3, at least some of the exemplary system 400 of FIG. 4, at least some of the exemplary system 500 of FIG. 5, and/or at least some of the exemplary system 600 of FIG. 6, for example. Many such computer-readable media may be devised by those of ordinary skill in the art that are configured to operate in accordance with the techniques presented herein.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 8:
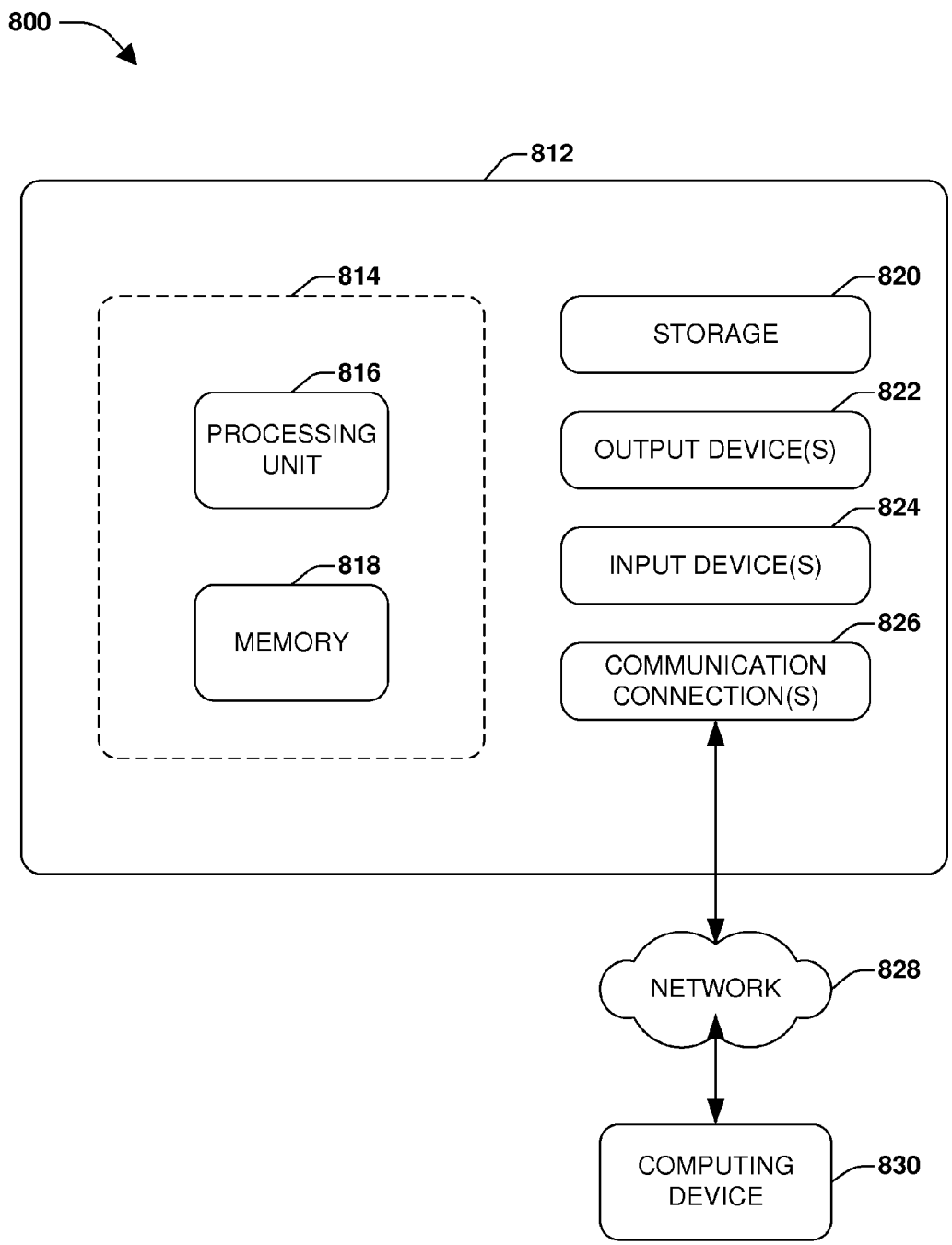
FIG. 8 illustrates an example computing environment wherein one or more of the provisions set forth herein may be implemented, in accordance with some embodiments.

FIG. 8 and the following discussion provide a brief, general description of a suitable computing environment to implement embodiments of one or more of the provisions set forth herein. The operating environment of FIG. 8 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 8 illustrates an example of a system 800 comprising a computing device 812 configured to implement one or more embodiments provided herein. In one configuration, computing device 812 includes at least one processing unit 816 and memory 818. Depending on the exact configuration and type of computing device, memory 818 may be volatile (such as RAM, for example), non-volatile (such as ROM, flash memory, etc., for example) or some combination of the two. This configuration is illustrated in FIG. 8 by dashed line 814.

In other embodiments, device 812 may include additional features and/or functionality. For example, device 812 may also include additional storage (e.g., removable and/or non-removable) including, but not limited to, magnetic storage, optical storage, and the like. Such additional storage is illustrated in FIG. 8 by storage 820. In some embodiments, computer readable instructions to implement one or more embodiments provided herein may be in storage 820. Storage 820 may also store other computer readable instructions to implement an operating system, an application program, and the like. Computer readable instructions may be loaded in memory 818 for execution by processing unit 816, for example.

The term "computer readable media" as used herein includes computer storage media. Computer storage media includes volatile and nonvolatile, removable and non-removable media implemented in any method or technology for storage of information such as computer readable instructions or other data. Memory 818 and storage 820 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 812. Any such computer storage media may be part of device 812.

Device 812 may also include communication connection(s) 826 that allows device 812 to communicate with other devices. Communication connection(s) 826 may include, but is not limited to, a modem, a Network Interface Card (NIC), an integrated network interface, a radio frequency transmitter/receiver, an infrared port, a USB connection, or other interfaces for connecting computing device 812 to other computing devices. Communication connection(s) 826 may include a wired connection or a wireless connection. Communication connection(s) 826 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 812 may include input device(s) 824 such as keyboard, mouse, pen, voice input device, touch input device, infrared cameras, video input devices, and/or any other input device. Output device(s) 822 such as one or more displays, speakers, printers, and/or any other output device may also be included in device 812. Input device(s) 824 and output device(s) 822 may be connected to device 812 via a wired connection, wireless connection, or any combination thereof. In some embodiments, an input device or an output device from another computing device may be used as input device(s) 824 or output device(s) 822 for computing device 812.

Components of computing device 812 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In another embodiment, components of computing device 812 may be interconnected by a network. For example, memory 818 may be comprised of multiple physical memory units located in different physical locations interconnected by a network.

Those skilled in the art will realize that storage devices utilized to store computer readable instructions may be distributed across a network. For example, a computing device 830 accessible via a network 828 may store computer readable instructions to implement one or more embodiments provided herein. Computing device 812 may access computing device 830 and download a part or all of the computer readable instructions for execution. Alternatively, computing device 812 may download pieces of the computer readable instructions, as needed, or some instructions may be executed at computing device 812 and some at computing device 830.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to an aspect of the instant disclosure, a method for scan cell assignment for a design layout is provided. The method comprises evaluating a design layout for a semiconductor arrangement to identify a set of sequential cells associated with the semiconductor arrangement. Control signal sequential cells within the set of sequential cells are assigned to a scan cell assignment based upon a control path criterion to generate an initial cell assignment list. Unassigned sequential cells within the set of sequential cells are assigned to either the scan cell assignment or a non-scan cell assignment based upon at least one of a register bank criterion, a pipeline criterion, or a sequential loop criterion to update the initial cell assignment list to create a cell assignment list.

According to an aspect of the instant disclosure, a system for scan cell assignment for a design layout is provided. The system comprises an assignment component configured to evaluate a design layout for a semiconductor arrangement to identify a set of sequential cells associated with the semiconductor arrangement. The assignment component is configured to assign sequential cells within the set of sequential cells to either a scan cell assignment or a non-scan cell assignment based upon at least one of a control path criterion, a register bank criterion, a pipeline depth criterion, or a sequential loop criterion to create a cell assignment list.

According to an aspect of the instant disclosure, a method for scan cell assignment for a design layout is provided. The method comprises evaluating a design layout for a semiconductor arrangement to identify a set of sequential cells associated with the semiconductor arrangement. Sequential cells within the set of sequential cells are assigned to either a scan cell assignment or a non-scan cell assignment based upon at least one of a control path criterion, a register bank criterion, a pipeline depth criterion, or a sequential loop criterion to create a cell assignment list.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for scan cell assignment for a design layout, comprising:
    evaluating a design layout for a semiconductor arrangement to identify a set of sequential cells associated with the semiconductor arrangement;
    creating a cell assignment list, comprising:
        assigning sequential cells within the set of sequential cells to a scan cell assignment based upon a control path criterion, the control path criterion specifying that sequential cells configured to store control signals be assigned to the scan cell assignment;
        assigning a first portion of the sequential cells that remain unassigned after the assigning to a non-scan cell assignment and a second portion of the sequential cells that remain unassigned after the assigning to the scan cell assignment based upon a non-scan cell threshold; and
        applying a register bank criterion to the set of sequential cells, the register bank criterion specifying that when a sequential cell that is a member of a register bank is assigned to the non-scan cell assignment, remaining sequential cells that are members of the register bank and assigned to the scan cell assignment be re-assigned to the non-scan cell assignment; and
    manufacturing the semiconductor arrangement according to the design layout, wherein during the manufacturing scan paths are connected to the sequential cells that have the scan cell assignment within the cell assignment list.

2. The method of claim 1, comprising:
    before the connecting, updating the cell assignment list by applying a pipeline depth criterion to the set of sequential cells, the pipeline depth criterion specifying that one or more sequential cells between a starting sequential cell of a pipeline and an ending sequential cell of the pipeline be assigned to the non-scan cell assignment according to a reduced non-scan cell assignment.

3. The method of claim 1, comprising:
before the connecting, updating the cell assignment list by applying a sequential loop criterion to the set of sequential cells, the sequential loop criterion specifying that at least one sequential cell that is a member of a structural sequential loop be assigned to the scan cell assignment.

4. The method of claim 1, the evaluating a design layout comprising:
generating a gate level netlist identifying the set of sequential cells.

5. The method of claim 1, comprising:
responsive to identifying a violation of the cell assignment list:
adjusting the non-scan cell threshold to create an adjusted non-scan cell threshold; and
adjusting at least one sequential cell assignment within the cell assignment list based upon the adjusted non-scan cell threshold.

6. The method of claim 1, comprising:
assigning sequential cells, assigned to the scan cell assignment, to one or more scan chains based upon the cell assignment list.

7. The method of claim 1, comprising:
evaluating the cell assignment list based upon a test coverage threshold metric; and
responsive to the cell assignment list not satisfying the test coverage threshold metric:
adjusting the non-scan cell threshold to create an adjusted non-scan cell threshold; and
adjusting at least one sequential cell assignment within the cell assignment list based upon the adjusted non-scan cell threshold.

8. The method of claim 1, the evaluating a design layout comprising:
identifying a flip flop as a sequential cell within the set of sequential cells.

9. The method of claim 1, comprising:
sending an input pattern to a sequential cell assigned to the scan cell assignment;
receiving an output pattern from the sequential cell assigned to the scan cell assignment; and
comparing the output pattern to an expected pattern to identify at least one of a design defect or a processing defect for the semiconductor arrangement.

10. A system for scan cell assignment for a design layout, comprising:
an assignment component configured to:
evaluate a design layout for a semiconductor arrangement to identify a set of sequential cells associated with the semiconductor arrangement; and
create a cell assignment list, comprising:
assigning sequential cells within the set of sequential cells to either a scan cell assignment or a non-scan cell assignment based upon a non-scan cell threshold; and
applying a sequential loop criterion to the set of sequential cells, the sequential loop criterion specifying that at least one sequential cell that is a member of a structural sequential loop be reassigned from the non-scan cell assignment to the scan cell assignment when the cell assignment list assigns sequential cells that are members of the structural sequential loop to merely the non-scan cell assignment; and
a testing component configured to connect scan paths to sequential cells that are members of the scan cell assignment within the cell assignment list during manufacturing of the semiconductor arrangement according to the design layout.

11. The system of claim 10, the assignment component configured to:
assign sequential cells within the set of sequential cells to the scan cell assignment based upon a control path criterion specifying that sequential cells configured to store control signals be assigned to the scan cell assignment to create an initial cell assignment list prior to the creating the cell assignment list.

12. The system of claim 10, the creating a cell assignment list comprising:
identifying a register bank comprising a sequential cell grouping of the set of sequential cells; and
responsive to identifying at least one sequential cell within the sequential cell grouping as being a non-scan cell assignment candidate, assigning sequential cells within the sequential cell grouping to the non-scan cell assignment based upon a register bank criterion.

13. The system of claim 10, the creating a cell assignment list comprising:
assigning a starting sequential cell, that lacks an assignment, of a pipeline to the scan cell assignment;
assigning an ending sequential cell, that lacks an assignment, of the pipeline to the scan cell assignment; and
assigning one or more sequential cells between the starting sequential cell and the ending sequential cell to the non-scan cell assignment according to a reduced non-scan cell assignment specified by a pipeline depth criterion.

14. The system of claim 10, the assignment component configured to:
identify the structural sequential loop within the design layout.

15. The system of claim 10, the assignment component configured to:
responsive to identifying a violation of the cell assignment list:
adjust the non-scan cell threshold to create an adjusted non-scan cell threshold; and
adjust at least one sequential cell assignment within the cell assignment list based upon the adjusted non-scan cell threshold.

16. The system of claim 10, the assignment component configured to:
evaluate the cell assignment list based upon a test coverage threshold metric; and
responsive to the cell assignment list not satisfying the test coverage threshold metric:
adjust the non-scan cell threshold to create an adjusted non-scan cell threshold; and
adjust at least one sequential cell assignment within the cell assignment list based upon the adjusted non-scan cell threshold.

17. The system of claim 10, the testing component configured to:
send an input pattern to a sequential cell assigned to the scan cell assignment;
receive an output pattern from the sequential cell assigned to the scan cell assignment; and
compare the output pattern to an expected pattern to identify at least one of a design defect or a processing defect for the semiconductor arrangement.

18. A method for scan cell assignment for a design layout, comprising:

evaluating a design layout for a semiconductor arrangement to identify a set of sequential cells associated with the semiconductor arrangement;

assigning sequential cells within the set of sequential cells to either a scan cell assignment or a non-scan cell assignment based upon a first criterion and based upon a non-scan cell assignment threshold to create a cell assignment list;

applying a register bank criterion to the set of sequential cells to update the cell assignment list, the register bank criterion specifying that when a sequential cell that is a member of a register bank is assigned to the non-scan cell assignment, remaining sequential cells that are members of the register bank and assigned to the scan cell assignment be re-assigned to the non-scan cell assignment; and manufacturing the semiconductor arrangement according to the design layout, wherein during the manufacturing scan paths are connected to the sequential cells that are members of the scan cell assignment after the cell assignment list is updated.

19. The method of claim 18, comprising, after the cell assignment list is updated:

sending an input pattern to a sequential cell assigned to the scan cell assignment;

receiving an output pattern from the sequential cell assigned to the scan cell assignment; and comparing the output pattern to an expected pattern to identify at least one of a design defect or a processing defect for the semiconductor arrangement.

20. The method of claim 18, the first criterion comprising a control path criterion specifying that sequential cells configured to store control signals be assigned to the scan cell assignment.

* * * * *